(12) United States Patent
Hustad et al.

(10) Patent No.: US 9,828,518 B2
(45) Date of Patent: Nov. 28, 2017

(54) COPOLYMER FORMULATIONS, METHODS OF MANUFACTURE THEREOF AND ARTICLES COMPRISING THE SAME

(71) Applicants: Dow Global Technologies LLC, Midland, MI (US); ROHM AND HAAS ELECTRONIC MATERIALS LLC, Marlborough, MA (US)

(72) Inventors: Phillip D. Hustad, Natick, MA (US); Peter Trefonas, III, Medway, MA (US); Jong Keun Park, Westborough, MA (US)

(73) Assignees: DOW GLOBAL TECHNOLOGIES LLC, Midland, MI (US); ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 0 days.

(21) Appl. No.: 14/580,303

(22) Filed: Dec. 23, 2014

(65) Prior Publication Data
US 2015/0184017 A1 Jul. 2, 2015

Related U.S. Application Data

(60) Provisional application No. 61/922,412, filed on Dec. 31, 2013.

(51) Int. Cl.
*H01L 21/311* (2006.01)
*H01L 21/308* (2006.01)
(Continued)

(52) U.S. Cl.
CPC ......... *C09D 133/08* (2013.01); *C09D 153/00* (2013.01); *G03F 7/0002* (2013.01);
(Continued)

(58) Field of Classification Search
None
See application file for complete search history.

(56) References Cited

U.S. PATENT DOCUMENTS 3,051,684 A 8/1962 Morton
3,257,476 A 6/1966 Tobolsky
(Continued)

FOREIGN PATENT DOCUMENTS

WO WO2009137678 A1 11/2009

OTHER PUBLICATIONS

Bosman et al., "A Modular Approach toward Functionalized Three-Dimensional Macromolecules: From Synthetic Concepts to Practical Applications" J. Am. Chem. Soc., 2003, 125 (3), 715-728.
(Continued)

*Primary Examiner* — Shamim Ahmed
(74) *Attorney, Agent, or Firm* — Cantor Colburn LLP

(57) ABSTRACT

Disclosed herein is a method comprising disposing a mat composition on a surface of a semiconductor substrate; where the mat composition comprises a random copolymer comprising a first acrylate unit and a second unit; where the copolymer does not comprise a polystyrene or a polyepoxide; crosslinking the random copolymer; disposing a brush backfill composition on the substrate; such that the brush backfill composition and the mat composition alternate with each other; disposing on the brush backfill composition and on the mat composition a block copolymer that undergoes self assembly; and etching the block copolymer to create uniformly spaced channels in the semiconductor substrate.

6 Claims, 6 Drawing Sheets

Linear Brush of Monomer A

(51) Int. Cl.

| | | |
|---|---|---|
| *H01L 21/02* | (2006.01) | |
| *C09D 133/08* | (2006.01) | |
| *C09D 153/00* | (2006.01) | |
| *G03F 7/00* | (2006.01) | |
| *H01L 21/027* | (2006.01) | |

(52) U.S. Cl.
CPC .... *H01L 21/0271* (2013.01); *H01L 21/31138* (2013.01); *C08L 2203/20* (2013.01); *C08L 2312/00* (2013.01)

(56) References Cited

U.S. PATENT DOCUMENTS

| | | | |
|---|---|---|---|
| 3,483,270 | A | 12/1969 | Bostick |
| 3,665,052 | A | 5/1972 | Saam |
| 3,890,405 | A | 6/1975 | Kendrick |
| 3,974,078 | A | 8/1976 | Crystal |
| 4,550,139 | A | 10/1985 | Arkles |
| 5,281,666 | A | 1/1994 | Hoxmeier |
| 5,296,574 | A | 3/1994 | Hoxmeier |
| 5,587,223 | A | 12/1996 | White |
| 5,686,549 | A | 11/1997 | Grainger |
| 5,948,470 | A | 9/1999 | Harrison |
| 6,025,117 | A | 2/2000 | Nakano |
| 6,565,763 | B1 | 5/2003 | Asakawa |
| 6,746,825 | B2 | 6/2004 | Nealey |
| 7,799,416 | B1 | 9/2010 | Chan |
| 7,901,866 | B2 | 3/2011 | Ito |
| 8,268,732 | B2 | 9/2012 | Sills |
| 8,304,493 | B2 | 11/2012 | Millward |
| 8,513,356 | B1 | 8/2013 | Sharma et al. |
| 8,697,810 | B2 | 4/2014 | Vogel et al. |
| 2006/0249784 | A1 | 11/2006 | Black |
| 2007/0049155 | A1 | 3/2007 | Moro |
| 2008/0193658 | A1 | 8/2008 | Millward |
| 2008/0233435 | A1 | 9/2008 | Hasegawa |
| 2008/0311402 | A1 | 12/2008 | Jung |
| 2009/0182093 | A1 | 7/2009 | Cheng |
| 2010/0151393 | A1 | 6/2010 | Kim et al. |
| 2011/0256359 | A1 | 10/2011 | Colburn |
| 2011/0272381 | A1 | 11/2011 | Millward |
| 2012/0088188 | A1 | 4/2012 | Trefonas |
| 2012/0107583 | A1 | 5/2012 | Xiao |
| 2013/0045361 | A1 | 2/2013 | Willson |
| 2013/0075360 | A1 | 3/2013 | Nakamura et al. |
| 2013/0171429 | A1 | 7/2013 | Liu |
| 2013/0209344 | A1 | 8/2013 | Chang |
| 2013/0209755 | A1 | 8/2013 | Hustad |
| 2014/0335324 | A1* | 11/2014 | Kim ............ B44C 1/227 428/195.1 |
| 2015/0184024 | A1 | 7/2015 | Chang |

OTHER PUBLICATIONS

Hahm, J. and Siebener, S. J., "Cylinder Alignment in Annular Structures of Microphase-Separated Polystyrene-b-Poly (methyl methacrylate)" Langmuir, 2000, 16 (11), pp. 4766-4769.

Han, E.; Stuen, K. O.; La, Y. H.; Nealey, P. F.; Gopalan, P., "Effect of Composition of Substrate-Modifying Random Copolymers on the Orientation of Symmetric and Asymmetric Diblock Copolymer Domains" Macromolecules 2008, 41 (23), 9090-9097.

Jung, S. J. and Ross, C. A., "Orientation-Controlled Self-Assembled Nanolithography Using a Polystyrene-Polydimethylsiloxane Block Copolymer" Nano Letters, 2007, 7, pp. 2046-2050.

Li et al., "Confinement of Block Copolymers on Patterned Surfaces" Macromolecules, 1997, 30 (26), pp. 8410-8419.

Liu, et al. "Fabrication of Lithographically Defined Chemically Patterned Polymer Brushes and Mats" Macromolecules 2011, 44 (7), pp. 1876-1885.

Mansky et al. "Nanometer Scale Periodic Modulation of a 2-D Electron System with Block Copolymers" Bull. Am. Phys. Soc. 36 (1991) 1051.

Mansky, P.; Chaikin, P. M.; Thomas, E. L. J. "Monolayer Films of Diblock Copolymer Microdomains for Nanolithographic Applications" Journal of Material Science 30 (1995) pp. 1987-1992.

Mansky, P.; Liu, Y.; Huang, E.; Russell, T. P.; Hawker, C. J., "Controlling Polymer-Surface Interactions with Random Copolymer Brushes" Science 1997, 275 (5305), 1458-1460.

Nealey et al., "Fabrication of Lithographically Defined Chemically Patterned Polymer Brushes and Mats" Macromolecules, 2011, 44, pp. 1876-1885.

Park et al., "Double textured cylindrical block copolymer domains via directional solidification on a topographically patterned substrate" Appl. Phys. Lett., 2001, 79, pp. 848-850.

Quirk et al., "Characterization of the Functionalization Reaction Product of Poly(styryl)lithium with Ethylene Oxide" Journal of Polymer Science: Part A: Polymer Chemistry, vol. 26, 2031-2037 (1988).

Russell et al., "Nonoscopic Templates from Oriented Block Copolymer Films" Advanced Materials (2000), 12, pp. 787-791.

Schulz et al., "Graft Polymers with Macromonomers. I. Synthesis from Methacrylate-Terminated Polystyrene" Journal of Applied Polymer Science, vol. 27, pp. 4773-4786 (1982).

Segalman et al., "Graphoepitaxy of Spherical Domain Block Copolymer Films" Advanced Materials (2001) 13, pp. 1152-1155.

Sundrani et al., "Guiding Polymers to Perfection: Macroscopic Alignment of Nanoscale Domains" Nano Letters (2004) 4, 273-276.

Sundrani et al., "Spontaneous Spatial Alignment of Polymer Cylindrical Nanodomains on Silicon Nitride Gratings" Macromolecules (2002) 35, 8531-8539.

Yerushalmi-Rozen et al., "Suppression of Rupture in Thin, Nonwetting Liquid Films" Science Feb. 11, 1994: vol. 263, pp. 793-795.

* cited by examiner

Linear Brush of Monomer A

Linear Block Copolymer Brush of Monomers A and B

Linear Gradient Copolymer Brush of Monomers A and B

Linear Random Copolymer Brush of Monomers A and B

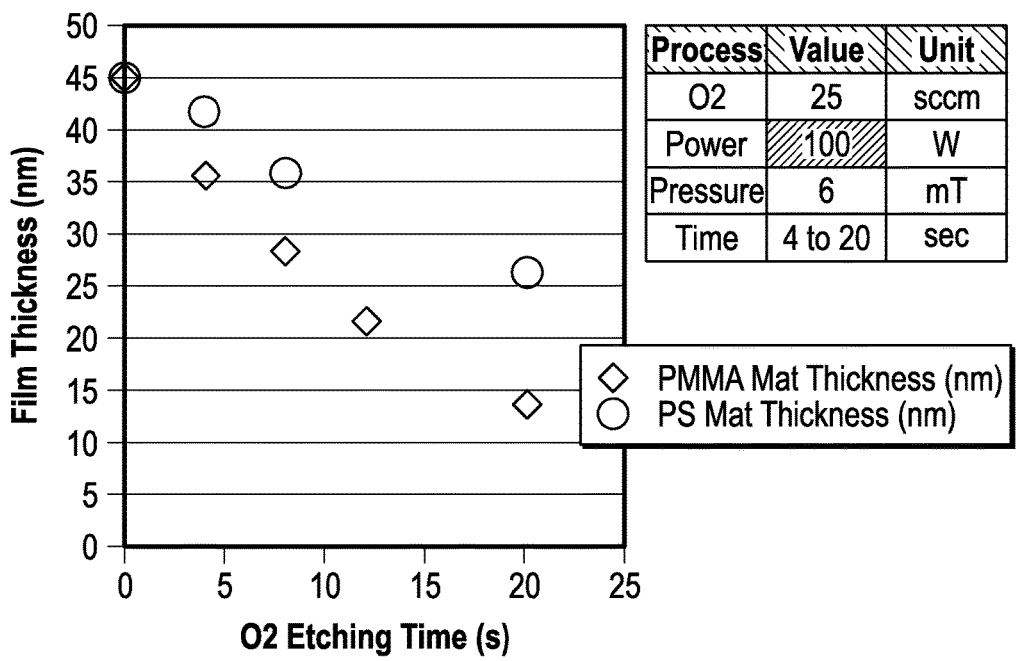
FIG. 5
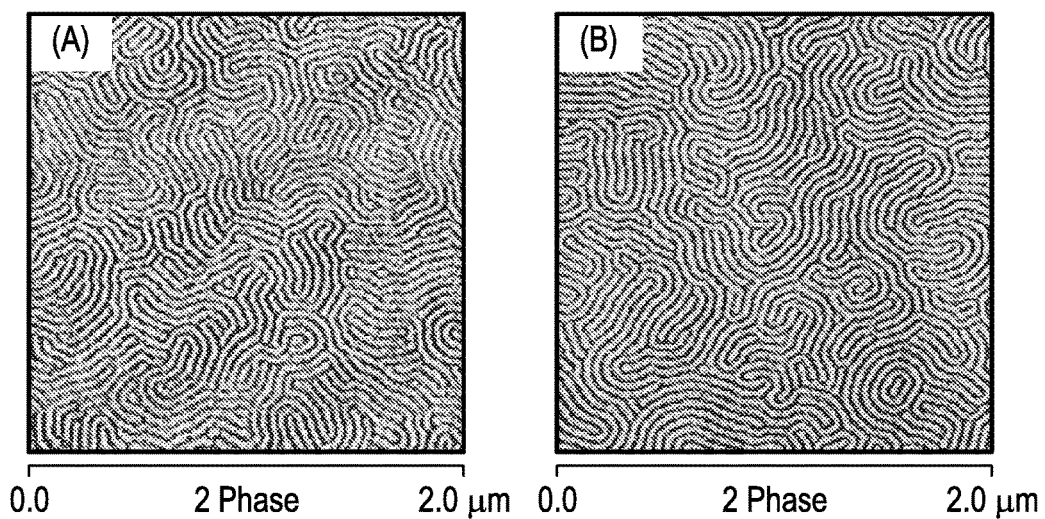
FIG. 6A  FIG. 6B

COPOLYMER FORMULATIONS, METHODS OF MANUFACTURE THEREOF AND ARTICLES COMPRISING THE SAME

This US Non-Provisional Application claims the benefit of U.S. Provisional Application Ser. No. 61/922,412, filed 31 Dec. 2013, the entire contents of which are hereby incorporated by reference.

BACKGROUND

This disclosure relates to copolymer formulations, methods of manufacture thereof and to articles comprising the same. In particular, the present disclosure relates to self assembled nanostructures obtained by disposing a block copolymer over a polymeric layer that exists in the form of a brush or a mat.

Block copolymers form self-assembled nanostructures in order to reduce the free energy of the system. Nanostructures are those having average largest widths or thicknesses of less than 100 nanometers. This self-assembly produces periodic structures as a result of the reduction in free energy. The periodic structures can be in the form of domains, lamellae or cylinders. Because of these structures, thin films of block copolymers provide spatial chemical contrast at the nanometer-scale and, therefore, they have been used as an alternative low-cost nano-patterning material for generating periodic nanoscale structures. This method of achieving periodic structures is termed directed self-assembly (DSA). In directed self-assembly, small pitch sizes are achieved by using the self-assembled block copolymer to lithographically pattern a substrate.

Copolymers that are primarily used in directed self-assembly are polystyrene-polymethylmethacrylate block copolymers and random polystyrene-polymethylmethacrylate copolymers that are used as a brush to control the surface energy of a substrate upon which the block copolymer is disposed. The directed self-assembled method used often involves disposing a cross-linked polystyrene mat 104 on a substrate 102 as shown in the FIG. 1. Following the crosslinking of the polystyrene mat 104, conventional lithography using a photoresist is used to make an array of lines 106 on the polystyrene mat 104. The lines 106 are then subjected to an etch process which trims them to a smaller dimension and removes the polystyrene mat 104 between the array of lines 106. The space between the lines 106 is then backfilled with the random polystyrene-polymethylmethacrylate copolymers 108 (hereinafter termed the backfill 108) to produce a brush coating. Following this, the polystyrene-polymethylmethacrylate block copolymer 110 is disposed on the backfill 108 and the strips of the polystyrene mat 104. The polystyrene mat strips 104 and the brush backfill 108 help anchor the domains of the polystyrene-polymethylmethacrylate block copolymer 110, as shown in the FIG. 1. From the FIG. 1, it may be seen that the polystyrene mat strips 104 are vertically aligned with the polystyrene domains of the polystyrene-polymethylmethacrylate block copolymer 110.

During directed self assembly, it is desirable to have the size of the polystyrene mat strips 104 match the size of the polystyrene domains in polystyrene-polymethylmethacrylate block copolymer 110 as shown in the FIG. 1 or 2. The FIG. 2 is an expanded version of the FIG. 1 showing the steps of lithography, etching and trimming, followed by the brush backfill and the consequent directed self assembly. The FIG. 2 reflects the end result of a desirable directed self assembly process. In particular, it may be seen that the etching that occurs after the directed self assembly produces equally spaced channels 112 in the substrate 102. However, this is not what occurs when crosslinked polystyrene is used as a mat as is detailed below in the FIG. 3.

In particular, as seen in the FIG. 3, the combination set (i.e., the polystyrene mat and the photoresist) suffers from a limitation in that the crosslinked polystyrene mat is much more etch resistant than the photoresist. This prevents the polystyrene mat strips 104 from being the same size as the polystyrene (lamellar or cylindrical) domains of the polystyrene-polymethylmethacrylate block copolymer 110. The differential etching rates between the crosslinked polystyrene and the photoresist produces non-uniform domains (i.e., trapezoidal shaped crosslinked polystyrene domains) in the crosslinked polystyrene mat. As a result of this non-uniform domain production, the resulting etched channels in the substrate have a bimodal distribution, which is undesirable.

It is therefore desirable to have a system (i.e., a mat composition and a brush composition) that facilitate the formation of uniform channels in the substrate during directed self assembly.

SUMMARY

Disclosed herein is a method comprising disposing a mat composition on a surface of a semiconductor substrate; where the mat composition comprises a random copolymer comprising a first acrylate unit and a second unit; where the copolymer does not comprise a polystyrene or a polyepoxide; crosslinking the random copolymer; disposing a brush backfill composition on the substrate; such that the brush backfill composition and the mat composition alternate with each other; disposing on the brush backfill composition and on the mat composition a block copolymer that undergoes self assembly; and etching the block copolymer to create uniformly spaced channels in the semiconductor substrate.

Disclosed herein too is a brush backfill composition for use in the manufacture of semiconductors comprising a poly(alkyl acrylate) having a functional group that can be reacted to a semiconductor substrate; where the brush backfill composition is disposed between strips of a mat composition; where the brush backfill composition and the mat composition are disposed upon the semiconductor substrate; and where the brush backfill composition has etch properties that are substantially similar to the etch properties of at least one component of a block copolymer that is disposed upon it.

BRIEF DESCRIPTION OF THE FIGURES

FIG. 4 is a schematic depiction of exemplary brush polymers.

FIG. 5 is a plot of film thickness as a function of O2 plasma etching time;

FIG. 6 shows fingerprint patterns generated by PS-b-PMMA on a PS-r-PMMA brush (A) and PEMA-OH (B) which were grafted onto a bare silicon wafer.

DETAILED DESCRIPTION

Figure 1:
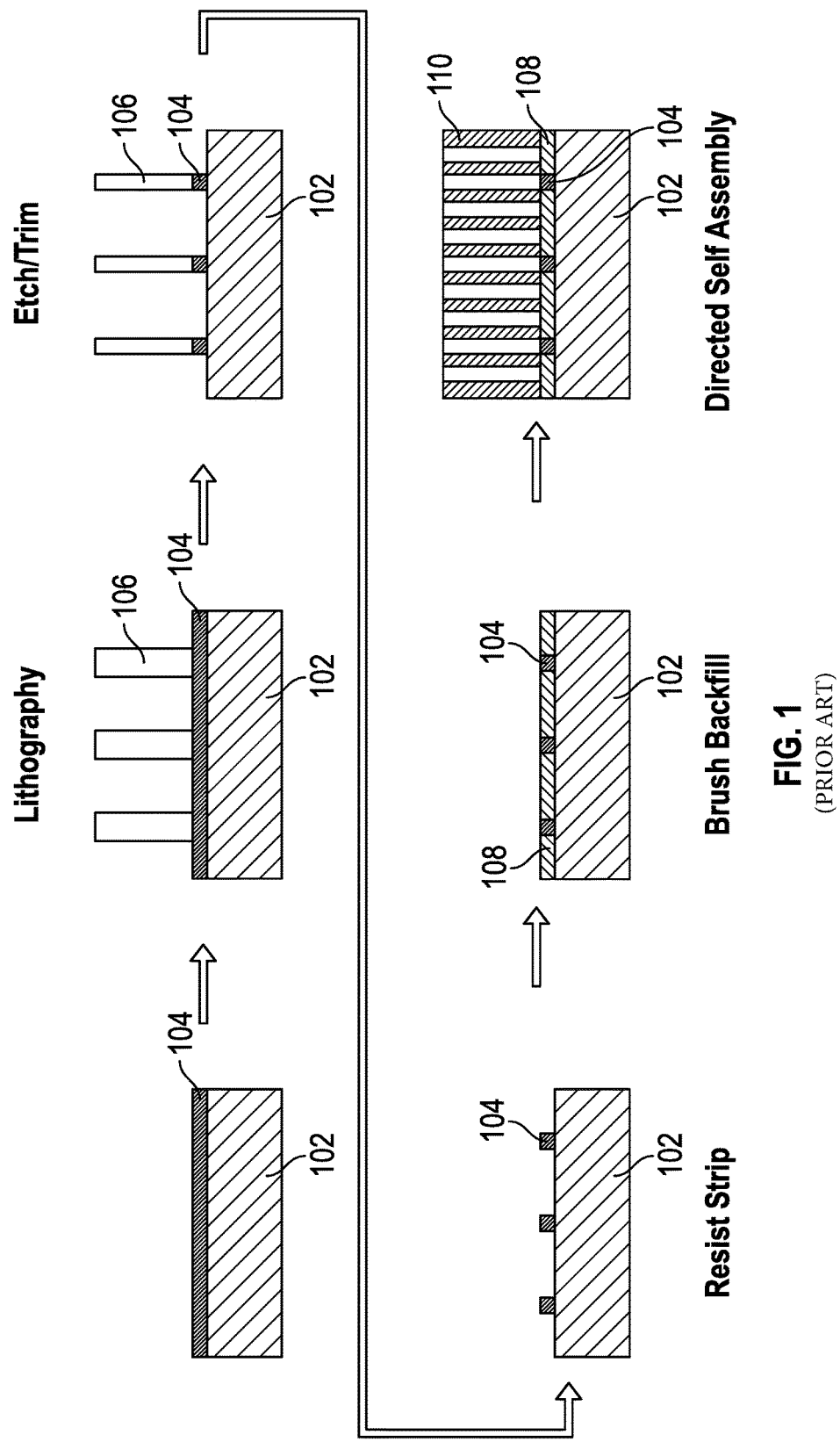
FIG. 1 is a schematic that depicts using directed self assembly to pattern a semiconductor substrate.
Figure 2:
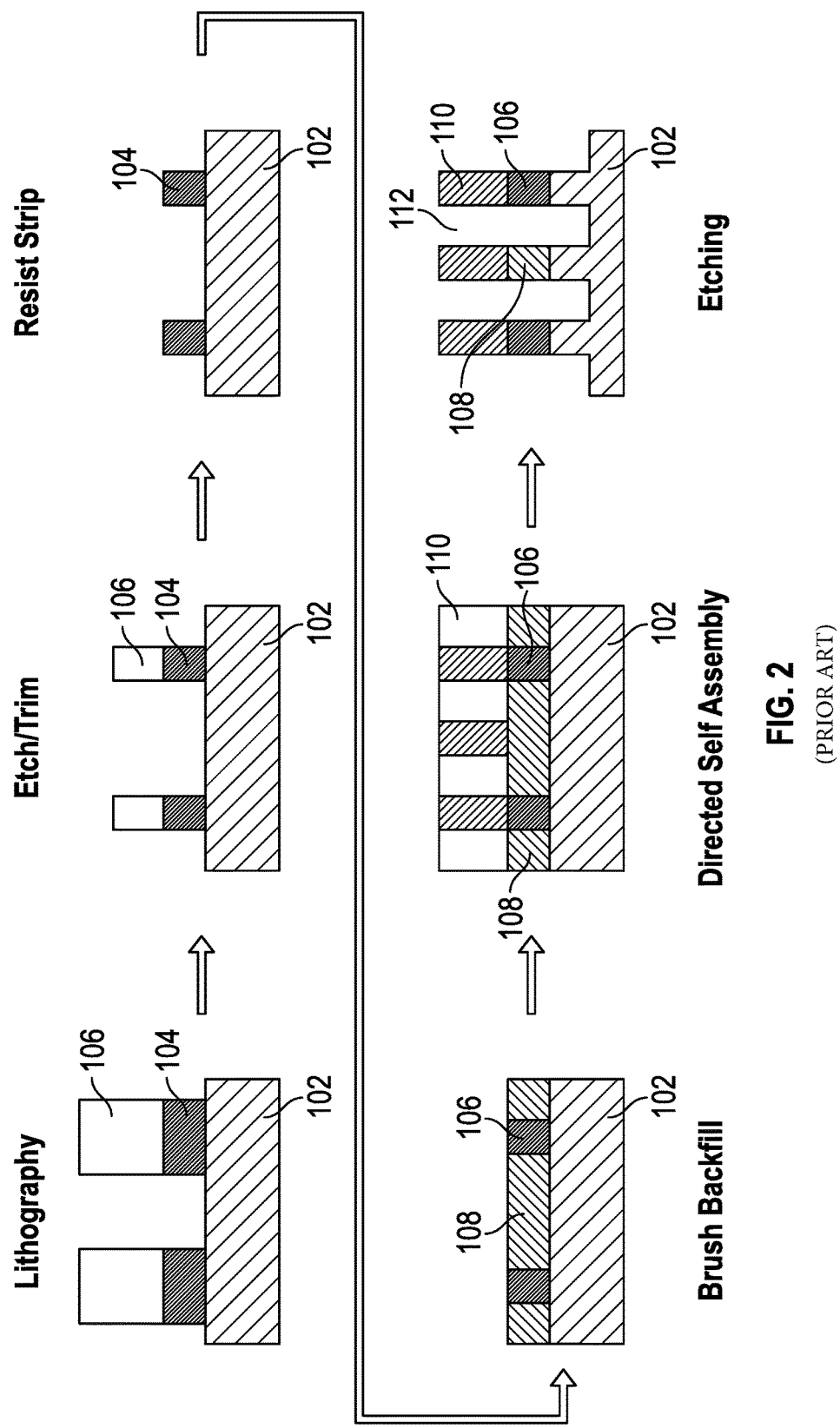
FIG. 2 is a magnified schematic that depicts how directed self assembly is to pattern uniformly spaced channels in the semiconductor substrate.
Figure 3:
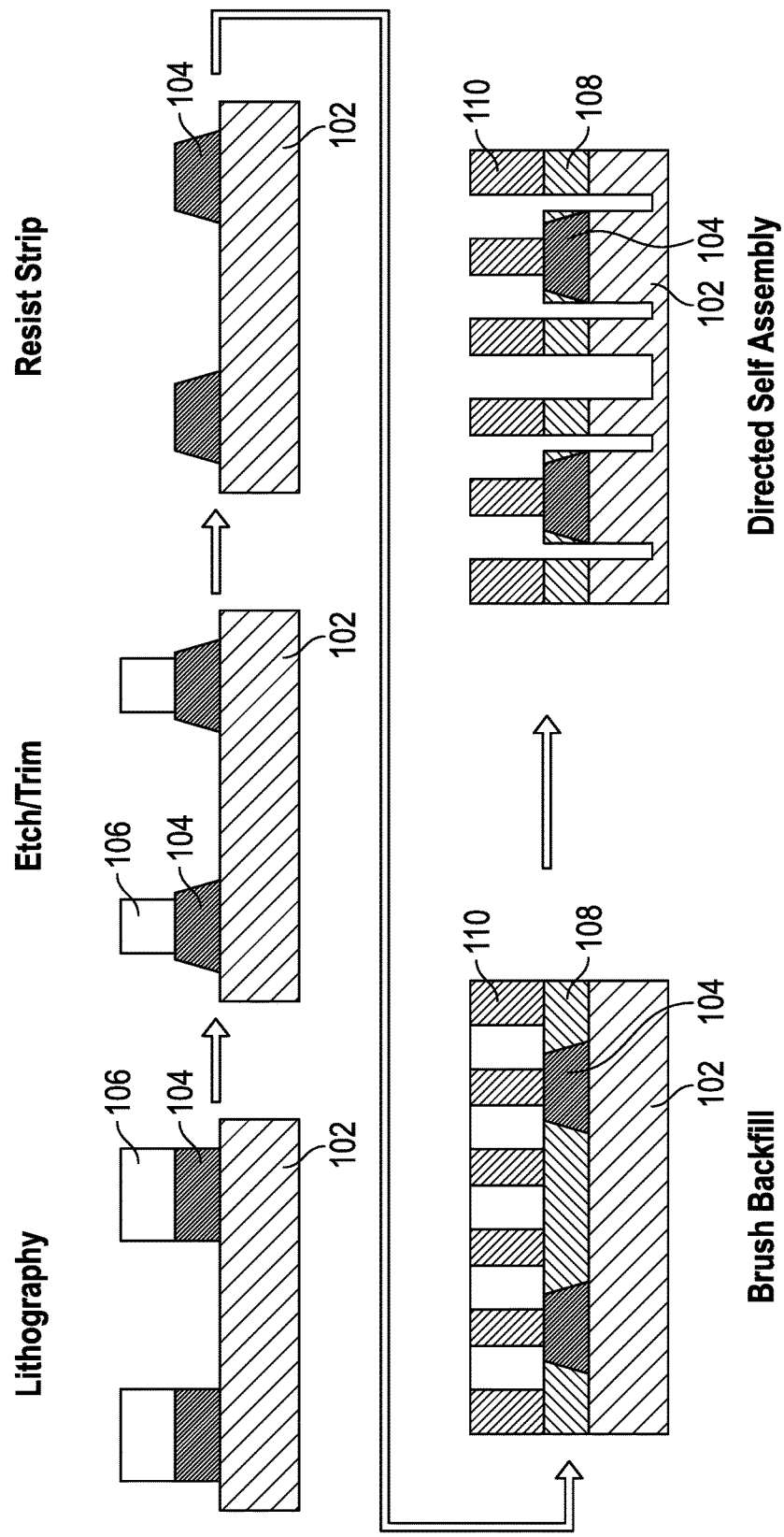
FIG. 3 depicts how differences in etch rate between the photoresist and the crosslinked mat produce undesirable non-uniformly spaced channels in the semiconductor substrate.
Figure 4A:
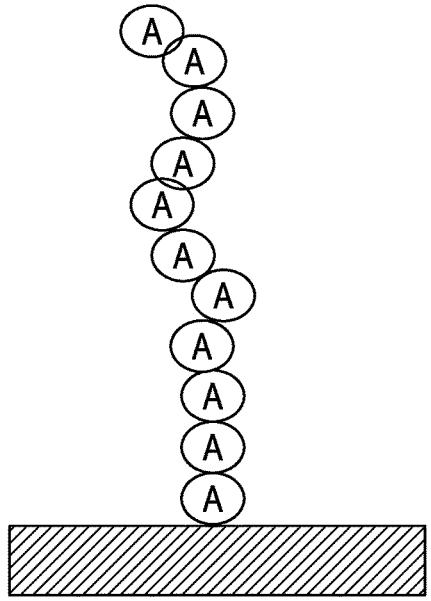
FIG. 4(A) depicts a linear brush polymer that comprises an exemplary monomer A.
Figure 4B:
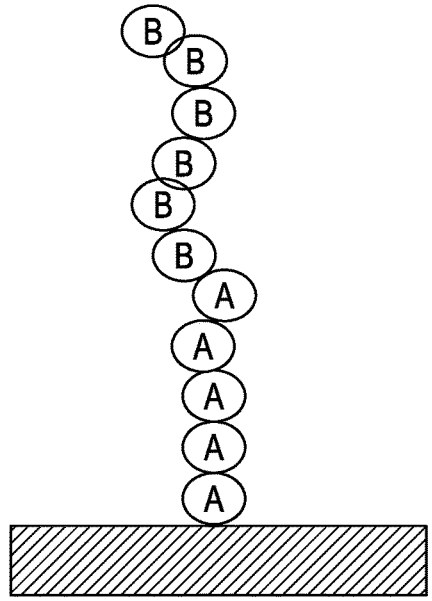
FIG. 4(B) depicts a linear block copolymer brush that comprises monomers A and B.
Figure 4C:
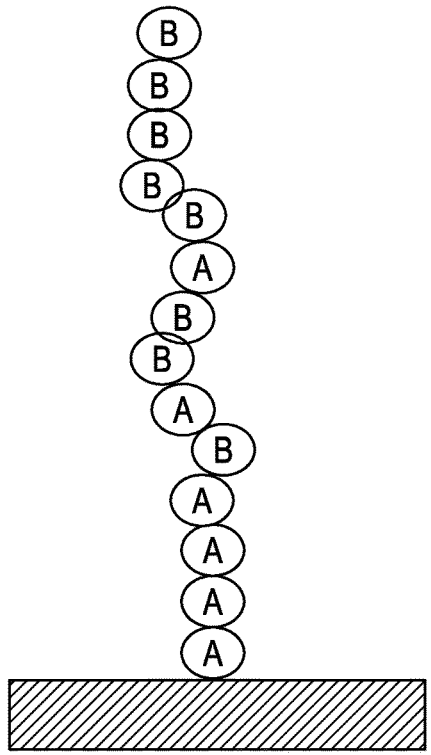
FIG. 4(C) depicts a linear gradient copolymer brush that comprises monomers A and B.
Figure 4D:
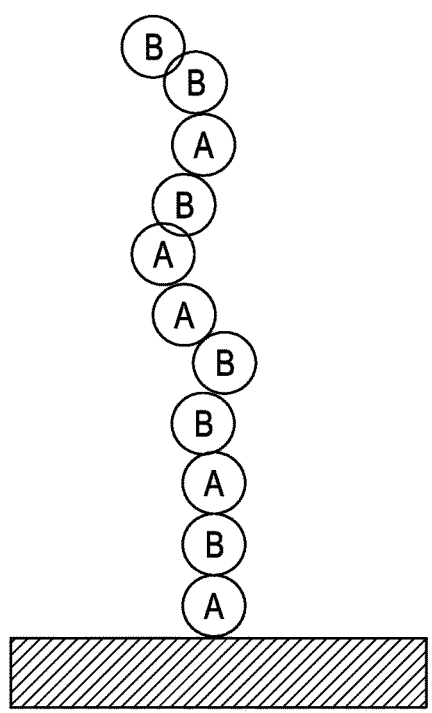
FIG. 4(D) depicts a random block copolymer brush that comprises monomers A and B.

In the process for developing semiconductors, it is desirable to have the etch resistance of the mat be similar to that of the photoresist used to pattern the semiconductor. In addition, it is desirable for the etch resistance of the backfilled neutral brush material to be similar to at least one of the phases of the block copolymer that is disposed upon it prior to the patterning of the semiconductor substrate. For directed self assembly copolymer systems that comprise a polystyrene-polymethylmethacrylate block copolymer, it is desirable for the brush material (which generally comprises a random copolymer of polystyrene and polymethylmethacrylate), to display a matching etch resistance to polyethylmethacrylate (of the block copolymer). If the etch resistance of the polymethylmethacrylate in the polystyrene-polymethylmethacrylate block copolymer is substantially similar to that of the mat, then uniform pattern spacings can be achieved in the semiconductor. However, the presence of the polystyrene in the brush backfill composition makes it more etch resistant than the polymethylmethacrylate in the block copolymer. This leads to non-uniform spacing in the pattern. It is therefore desirable to have brush materials with etch properties similar to the etch properties of at least one component of the block copolymer that is disposed upon it.

Disclosed herein is a composition comprising a combination of a mat composition and a brush backfill composition that can be used to effectively produce a uniform spacing between the channels in a patterned semiconductor. The mat composition comprises at least one polymeric component that has a similar etch resistance to that of the photoresist as well as to at least one component present in the brush backfill composition. This matching of etching rates between the mat composition and the brush backfill composition facilitates the formation of uniform channel spacing in the patterned substrate upon which the mat composition and the brush backfill composition are disposed. In addition to matching the etch resistance it is desirable to match surface energies of the photoresist, the mat composition and the brush backfill composition as well.

In an embodiment, the mats comprise an acrylate and are free of polystyrene to provide etch properties similar to the photoresist used for patterning the mat material, thus enabling etch trimming to give lines of the mat material that are more closely matched to the dimensions of the domains of the block copolymer. In short, the at least one component of the mat that has an etch resistance (or conversely an etch rate) that is similar to the photoresist and similar to the brush backfill is an acrylate. This feature provides better registration of the block copolymer domains and solves issues with pattern transfer to provide a final etched pattern with improved critical dimension uniformity (CDU).

In an exemplary embodiment, the mat composition comprises a copolymer of two or more acrylates. The brush backfill composition also comprises an acrylate and the etch rate of the acrylate in the mat composition is substantially similar to the etch rate of the acrylate in the brush backfill composition.

The mat composition comprises a copolymer that comprises a first block that is copolymerized with a second block. In an exemplary embodiment, the first block is a first polyacrylate, and the second block is second polyacrylate. The copolymer can be a block copolymer (e.g., a diblock copolymer or a triblock copolymer), a star block copolymer, an ionic block copolymer, or the like, where at least one of the blocks is an acrylate and where at least one or more of the blocks is capable of being physically or chemically crosslinked. In an exemplary embodiment, the mat composition comprises a block copolymer. In another exemplary embodiment, the mat composition comprises random copolymers of the two acrylates, where at least one or more of the acrylates is capable of being physically or chemically crosslinked.

The first polymer of the random copolymer is derived from the polymerization of an acrylate monomer. In one embodiment, the first repeat unit (i.e., the acrylate monomer) has a structure represented by formula (1):

where $R_1$ is a hydrogen or an alkyl group having 1 to 10 carbon atoms. Examples of the first repeat monomer are acrylates and alkyl acrylates such as α-alkyl acrylates, methacrylates, ethacrylates, propyl acrylates, butyl acrylate, or the like, or a combination comprising at least one of the foregoing acrylates.

In one embodiment, the first repeat unit has a structure derived from a monomer having a structure represented by the formula (2):

where $R_1$ is a hydrogen or an alkyl group having 1 to 10 carbon atoms and $R_2$ is a $C_{1-10}$ alkyl, a $C_{3-10}$ cycloalkyl, or a $C_{7-10}$ aralkyl group. Examples of the alkyl(α-alkyl)acrylates are methacrylate, ethacrylate, propyl acrylate, methyl methacrylate, methyl ethylacrylate, methyl propylacrylate, ethyl ethylacrylate, methyl arylacrylate, or the like, or a combination comprising at least one of the foregoing acrylates. The term "(α-alkyl)acrylate" implies that either an acrylate or (α-alkyl)acrylate is contemplated unless otherwise specified.

The second unit of the random copolymer is also a polymer and contains a moiety that can undergo crosslinking. The crosslinkable moieties are polymeric and are shown below in formulas I-1 to I-20:
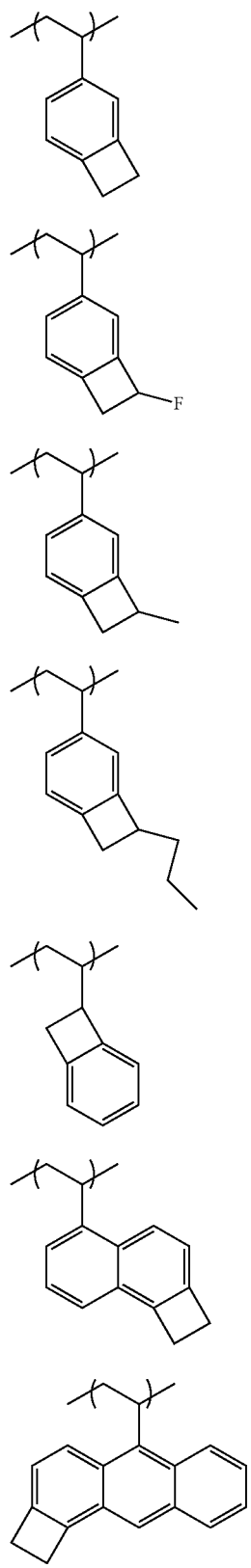
-continued
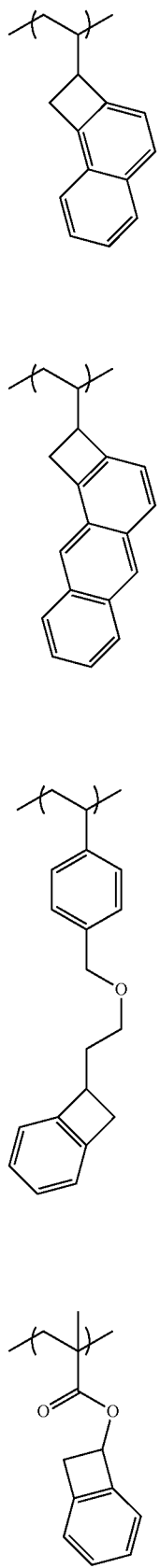

(I-12) 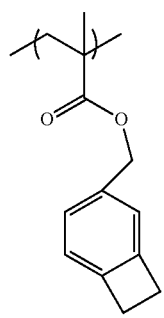
(I-13) 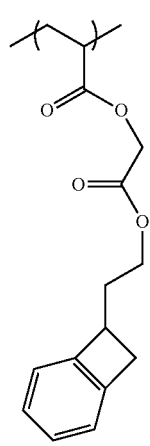
(I-14) 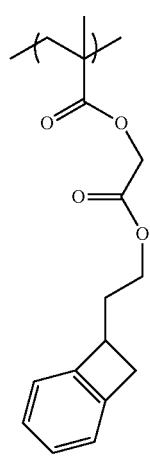
(I-15) 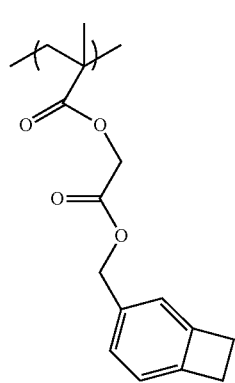
(I-16) 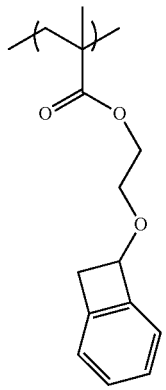
(I-17) 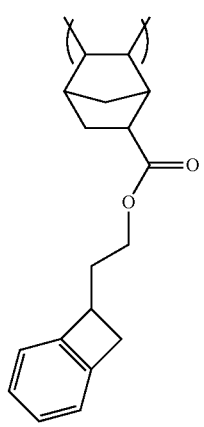
(I-18) 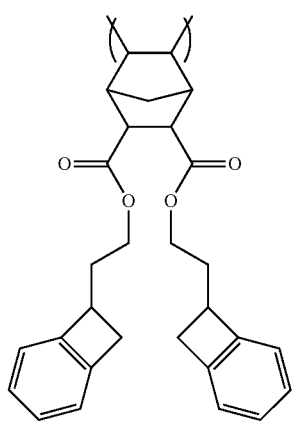
(I-19) 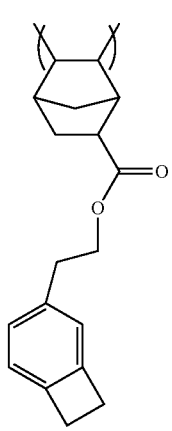

(I-20)
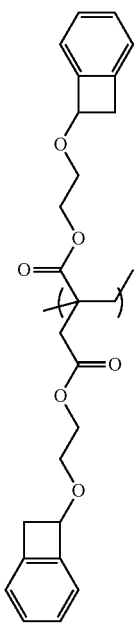
Suitable crosslinkable moieties are arylcyclobutene monomers such as those shown below in formulas M-1 to M-27:
(M-1)
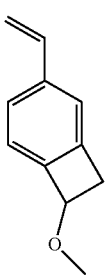
(M-2)
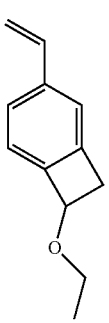
(M-3)
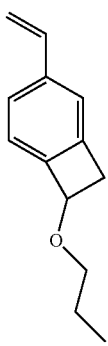
(M-4)
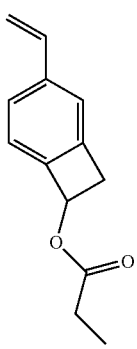
(M-5)
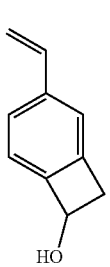
(M-6)
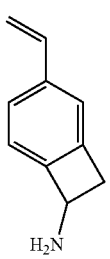
(M-7)
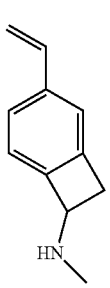

-continued
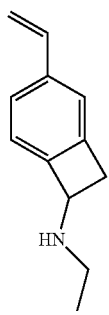
(M-8)
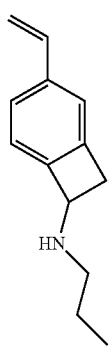
(M-9)
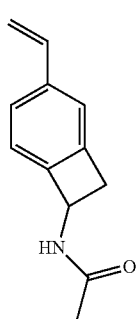
(M-10)
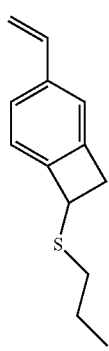
(M-11)
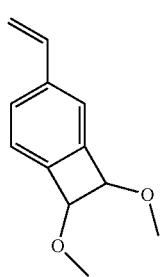
(M-12)
-continued
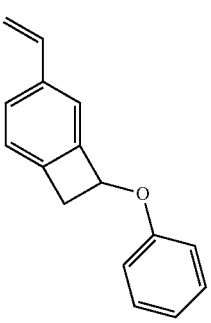
(M-13)
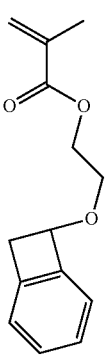
(M-14)
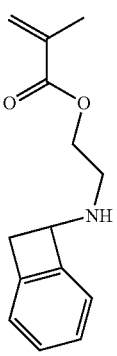
(M-15)
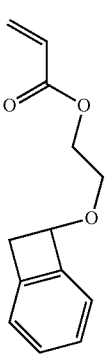
(M-16)

-continued
(M-17)
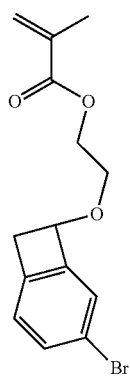
(M-18)
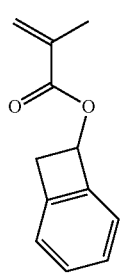
(M-19)
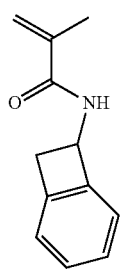
(M-20)
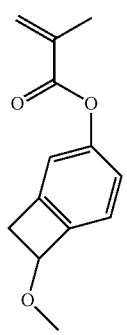
(M-21)
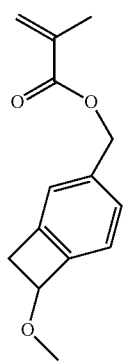
-continued
(M-22)
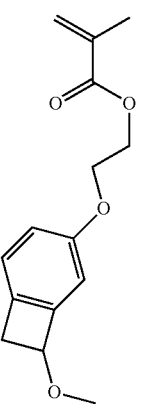
(M-23)
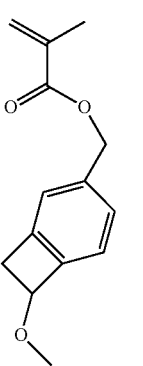
(M-24)
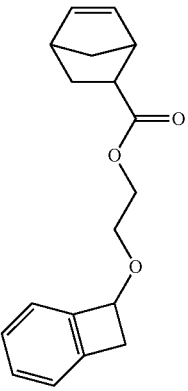
(M-25)
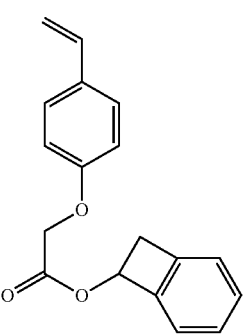

(M-26)

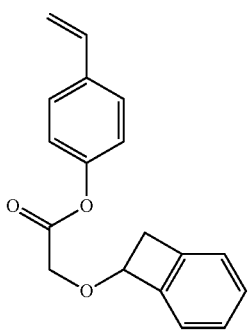

(M-27)

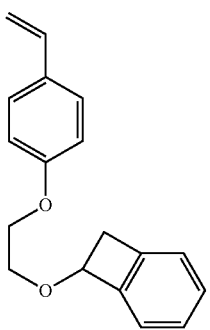

In an exemplary embodiment, the second unit is a polymer derived from the polymerization of 2-(1,2-dihydrocyclobutabenzen-1-yloxy)ethyl methacrylate shown below in the formula (3)

(3)

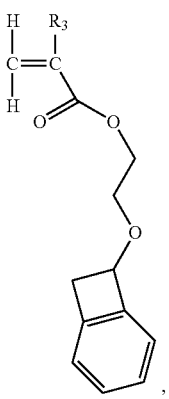

where $R_3$ can be a $C_{1-10}$ alkyl, a $C_{3-10}$ cycloalkyl, or a $C_{7-10}$ aralkyl group.

In one embodiment, the mat prior to crosslinking is a random copolymer that has the structure shown in the formula (4)

(4)

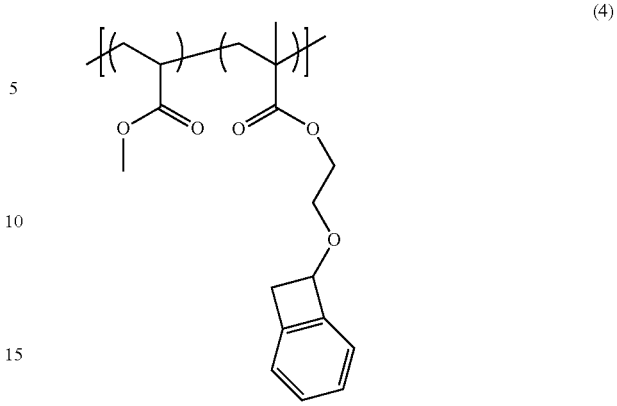

where the copolymer has a number average molecular weight of 5,000 to 1,000,000 grams per mole, preferably 10,000 to 100,000 grams per mole, and a composition of the monomer with crosslinkable functionality of 1 to 90 mole %, preferably 2-10 mole %.

The end group (also referred to herein as the "attachment group") of the random copolymer can optionally be a group containing a reactive functional group capable of forming a covalent bond to a substrate or inducing crosslinking in the polymer film. The end group may be a hydroxy, thiol, or primary or secondary amine substituted, straight chain or branched $C_{1-30}$ alkyl, $C_{3-30}$ cycloalkyl, $C_{6-30}$ aryl, $C_{7-30}$ alkaryl, $C_{7-30}$ aralkyl, $C_{1-30}$ heteroalkyl, $C_{3-30}$ heterocycloalkyl, $C_{6-30}$ heteroaryl, $C_{7-30}$ heteroalkaryl, $C_{7-30}$ heteroaralkyl or a combination comprising at least one of these groups. As used herein, the prefix "hetero" refers to any non-carbon, non-hydrogen atom including, for example, the halogens (fluorine, chlorine, bromine, iodine), boron, oxygen, nitrogen, silicon, or phosphorus, unless otherwise specified.

In on embodiment, the end groups include 3-aminopropyl, 2-hydroxyethyl, 2-hydroxypropyl, or 4-hydroxyphenyl. Alternatively, or in addition to these functional groups, other reactive functional groups may be included to facilitate bonding of the acid sensitive copolymer to the surface of a substrate.

In another embodiment, the end groups include mono-, di- and trialkoxysilane groups such as 3-propyltrimethoxysilane (obtained by the copolymerization of other monomers with trimethoxysilylpropyl(meth)acrylate), or glycidyl groups (obtained by the copolymerization with glycidyl(meth)acrylate). In addition, groups capable of crosslinking, such as benzocyclobutene, azide, acryloyl, glycidyl, or other crosslinkable groups may be used. Useful monomers which provide the epoxy-containing attachment group include monomers selected from the group consisting of glycidyl methacrylate, 2,3-epoxycyclohexyl(meth)acrylate, (2,3-epoxycyclohexyl)methyl(meth)acrylate, 5,6-epoxynorbornene (meth)acrylate, epoxydicyclopentadienyl(meth)acrylate, and combinations comprising at least one of the foregoing.

Exemplary end groups are hydroxyl groups, carboxylic acid groups, epoxy groups, silane groups, or a combination comprising at least one of the foregoing groups.

In one method of manufacturing the mat composition, a first acrylate monomer is mixed with the second acrylate monomer and a solvent in a first reactor to form a reaction solution. A separate amount of the solvent is taken separately in a second reactor that is fitted with a condenser and an agitator. The solvent in the second reactor is heated to a temperature between 60 and 200° C., preferably 70 and 140° C. in an inert atmosphere. The initiator is separately dissolved in the solvent to form an initiator solution. The initiator solution and the reaction solution are then added to the second reactor. The reaction solution may be added slowly to the second reactor, while the contents of the second reactor are being agitated and are under an inert atmosphere. The reaction proceeds for 2 to 4 hours and the second reactor and its contents are retained for 30 minutes to 2 hours after the reaction is completed. The polymerized acrylates (now in the form of a polyacrylate random copolymer) are cooled down to room temperature. The polyacrylate random copolymer is precipitated in another solvent and is then purified.

Solvents used for the reaction to manufacture the mat composition are listed below. An exemplary solvent is an ethylene glycol (e.g., propylene glycol methyl ether acetate (PGMEA)).

The polymers can be made using free radical initiators such as azobisisobutyronitrile (AIBN), 1,1'-azobis(cyclohexane-carbonitrile) (ACHN), 2,2'-azobis(2-methylpropionamidine)dihydrochloride (AAPH), 4,4'-azobis(4-cyanovaleric acid) (ACVA), also called 4,4'-azobis(4-cyanopentanoic acid), di-tert-butyl peroxide (tBuOOtBu), benzoyl peroxide ((PhCOO)$_2$), methyl ethyl ketone peroxide, tert-amyl peroxybenzoate, dicetyl peroxydicarbonate, or the like or a combination comprising at least one of the foregoing initiators. The first initiator may also be a radical photoinitiator. Examples are benzoyl peroxide, benzoin ethers, benzoin ketals, hydroxyacetophenone, methylbenzoyl formate, anthroquinone, triarylsulfonium hexafluorophosphate salts, triarylsulfonium hexafluoroantimonate salts, phosphine oxide compounds such as IRGACURE® 2100 and 2022 (sold by BASF), or the like, or a combination comprising at least one of the foregoing radical initiators.

In some embodiments, narrow molecular weight and composition distribution are preferred. In these cases, the polymers can be made using living or controlled free radical polymerization techniques, including reversible addition fragmentation chain transfer polymerization (RAFT), nitroxide mediated polymerization (NMP), atom transfer radical polymerization (ATRP), and the like. RAFT polymerization uses thiocarbonylthio compounds, such as dithioesters, thiocarbamates, and xanthates, to mediate the polymerization via a reversible chain-transfer process. The polymer is produced by reacting the monomer with a dithioester chain transfer agent and an initiator to produce the polymer.

Suitable chain transfer reagents for the RAFT polymerization are thiocarbonylthio compounds, such as dithioesters, thiocarbamates, and xanthates, and include: 2-cyano-2-propyl benzodithioate, 4-cyano-4-(phenylcarbonothioylthio) pentanoic acid, 2-cyano-2-propyldodecyl trithiocarbonate, 4-cyano-4-[(dodecylsulfanylthiocarbonyl)sulfanyl]pentanoic acid, 2-(dodecylthiocarbonothioylthio)-2-methylpropionic acid, cyanomethyl dodecyl trithiocarbonate, cyanomethyl methyl (phenyl)carbamodithioate, bis(thiobenzoyl)disulfide, bis(dodecylsulfanyl-thiocarbonyl)disulfide, or the like.

Nitroxide mediated polymerization, or NMP, which uses stable nitroxide radicals or alkoxyamines as initiators, can also be used to make the polymers. Examples of suitable initiators for NMP include N-tert-butyl-N-(2-methyl-1-phenylpropyl)-O-(1-phenylethyl) hydroxylamine, N-tert-butyl-O-[1-[4-(chloromethyl)phenyl]ethyl]-N-(2-methyl-1-phenylpropyl)hydroxylamine, 2,2,5-trimethyl-4-phenyl-3-azahexane-3-nitroxide, 2,2,6,6-tetramethyl-1-piperidinyloxy (TEMPO), and the like.

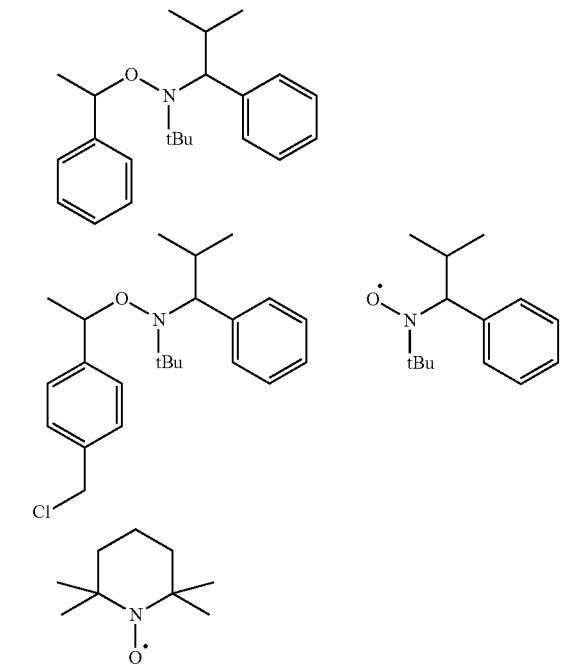

The polymers can also be made using atom transfer radical polymerization, or ATRP. Suitable initiators for ATRP include tert-butyl α-bromoisobutyrate, α-bromoisobutyryl bromide, dodecyl 2-bromoisobutyrate, ethyl α-bromoisobutyrate, methyl α-bromoisobutyrate, octadecyl 2-bromoisobutyrate, and the like. Suitable catalysis for ATRP include copper(I) chloride, copper(II) chloride, copper(I) bromide, copper(II) bromide, copper(I) iodide, and the like. Suitable ligands for ATRP include tris(2-pyridylmethyl)amine, tris[2-(dimethylamino)ethyl]amine, 4,4'-dinonyl-2,2'-dipyridyl, N,N,N',N'',N''-pentamethyldiethylenetriamine, and the like.

The initiator is used in molar ratio of 0.05 to 0.2 with respect to the chain transfer agent. In an exemplary embodiment, the initiator is used in molar ratio of 0.07 to 0.18 with respect to the chain transfer agent.

As noted above, it is desirable for the brush backfill composition to have the same etch resistance as the mat composition. It is therefore desirable for the brush backfill composition to contain the same chemical and structural molecular features as those contained by the mat composition.

The etch resistance of polymers can be compared by calculating their respective Ohnishi numbers. An empirical relationship discovered by Ohnishi states the etch rate of polymers is a function of the Ohnishi number, O. N., which is calculated according to the following equation:

$$O.N. = N/(N_C - N_O)$$

where N is the total number of atoms in the repeat unit, $N_C$ is the number of carbon atoms in the repeat unit, and $N_O$ is the number of oxygen atoms in the repeat unit. Polymers with higher O.N.'s have faster oxygen etch rates.

For copolymers, the O.N. is estimated from the composition as the average of the O.N. of the component monomers. For example, the O.N. of a copolymer of A and B monomers is represented by the following equation:

$$O.N._{AB} = f_A \, O.N._A + f_B \, O.N._B$$

where f is the molar fraction and O.N. the respective Ohnishi number of the monomer. It is desirable for the brush and mat to have similar Ohnishi numbers. Furthermore, it is desirable for the brush and mat to have Ohnishi numbers higher than those of the P(S-r-MMA) copolymers currently used for directed self assembly.

In an embodiment, the brush backfill composition comprises a polyacrylate that is endcapped with a reactive functionality. The reactive group covalently bonds to the substrate surface with the chain backbone being disposed parallel to the substrate surface, thus providing a brush like appearance as seen in the structures for formula (4). The brush backfill composition may comprise a polymer or alternatively a block or random copolymer. Polymer brushes are analogous in morphology to a field of grass, where the polymer is the grass and is disposed on a substrate (which is analogous to the soil in which the grass grows). The brush backfill composition can comprise one or more of the polymeric structures shown below in formula (4a-4f):

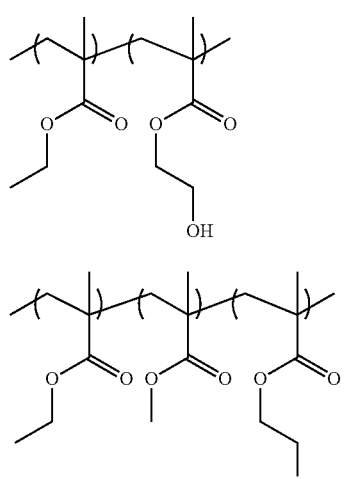

(4a)

(4b)

(4c)

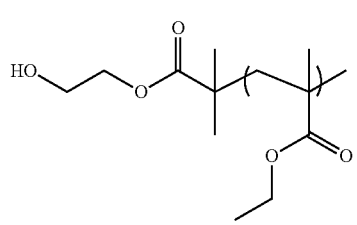

(4d)

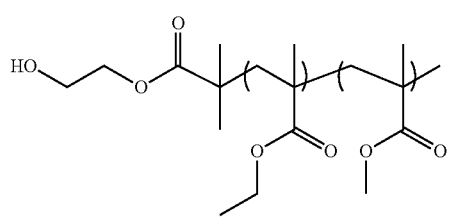

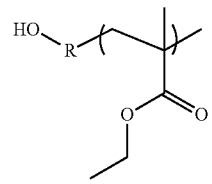

(4e)

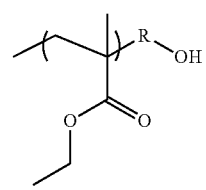

(4f)

where OH is the reactive species. The reactive groups on the brush polymer can be an alkoxy group, a carboxyl group, a thiol group, a phenol, a hydroxyl aromatic, a hydroxyl heteroaromatic, an aryl thiol, a hydroxyl alkyl, a primary hydroxyl alkyl, a secondary hydroxyl alkyl, a tertiary hydroxyl alkyl, an alkyl thiol, a hydroxyl alkene, a melamine, a glycoluril, a benzoguanamine, an epoxy, a urea, or combinations thereof.

In an embodiment, the brush backfill layer comprises a polymer having the structure of formula (5) or formula (6)

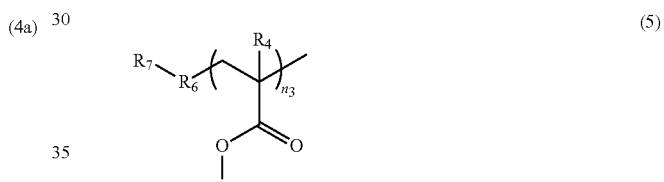

(5)

, or

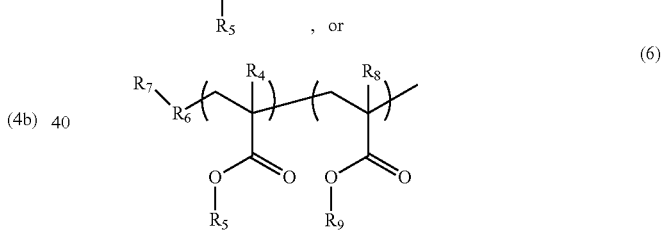

(6)

where R5 through R9 can be one of the reactive species listed above.

Examples of the brush backfill polymer are poly(alkyl acrylate)s such as polyethylacrylate, polymethylacrylate, polybutylacrylate, polyethylmethacrylate polymethylmethacrylate, polybutylmethacrylate, poly(1,1,1-trifluoroethylmethacrylate), or the like, or a combination comprising at least one of the foregoing poly(alkyl acrylates).

An exemplary brush backfill composition comprises a polyethylmethacrylate that is endcapped with the hydroxyethyl ester shown in the formula (7) below:

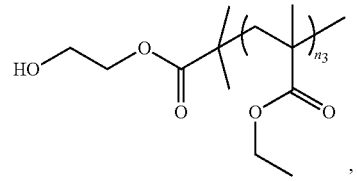

(7)

where $n_3$ is 25 to 1000, preferably 50 to 400.

End-functional brush polymers can be manufactured using living polymerization techniques such as anionic polymerization or living free radical polymerization, including ATRP, RAFT, and NMP. Suitable initiators for ATRP include tert-butyl α-bromoisobutyrate, α-bromoisobutyryl bromide, dodecyl 2-bromoisobutyrate, ethyl α-bromoisobutyrate, methyl α-bromoisobutyrate, octadecyl 2-bromoisobutyrate, and the like.

Examples of initiators for making end-functional polymers using reversible addition fragmentation chain transfer polymerization (RAFT) include structures of the formulas (8)-(12):

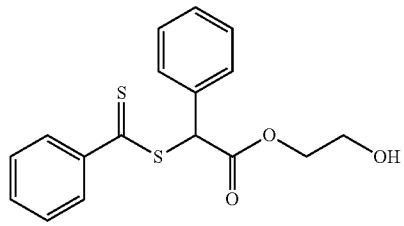

(8)

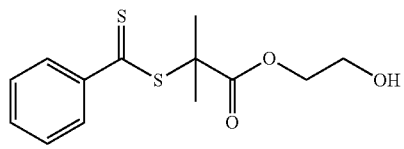

(9)

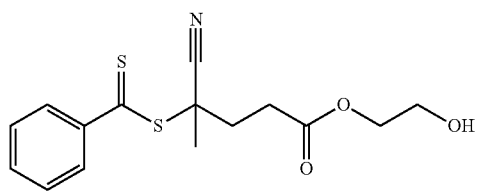

(10)

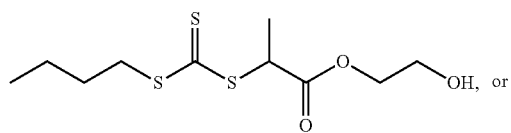

(11)

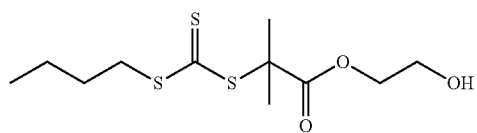

(12)

Examples of initiators for making end-functional polymers using nitroxide mediated polymerization (NMP) include structures of the formulas (13)-(15):

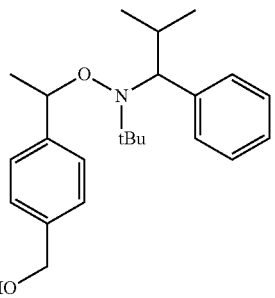

(13)

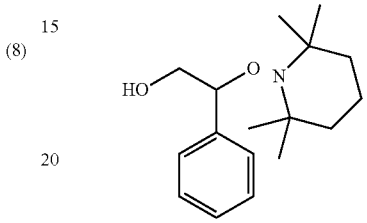

(14)

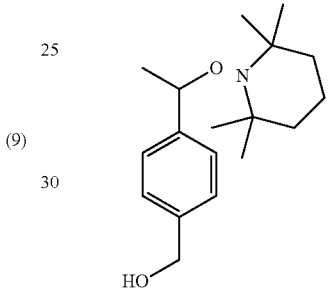

(15)

In one embodiment, in one method of manufacturing the brush backfill composition, an acrylate monomer (e.g., ethyl methacrylate) is purified and then disposed in a reactor with anisole, N,N,N',N'',N''-pentamethyldiethylenetriamine, an initiator and solvent. The temperature of the reactor is increased to 90 to 130° C. and initiator was added to the reactor. The reaction mixture was stirred under a nitrogen blanket. The polymerization is stopped when the molecular weight of the polymer has reached a desired molecular weight. The polymer is then precipitated in another solvent and is subjected to purification to produce the brush backfill composition. Purification may involve centrifugation, filtration, distillation, decantation, evaporation, treatment with ion exchange beads, and the like.

In one embodiment, in one method of using the mat composition and the brush backfill composition to pattern a semiconductor, a semiconductor substrate surface is optionally cleaned following which the mat composition comprising the polyacrylate random copolymer is disposed on it. The mat composition may be mixed with a first solvent and an initiator and disposed upon the surface by spin casting, spray painting, dip coating, and the like. The substrate may be annealed in a vacuum to remove any residual traces of the first solvent. The mat is then crosslinked using radiation or by heating. Radiation of the mat composition may be brought about by ultraviolet radiation, xray radiation, electron beam radiation, infrared or microwave radiation.

When the mat composition is crosslinked, the poly(2-(1,2-dihydrocyclobutabenzen-1-yloxy)ethyl methacrylate) reacts with itself to crosslink the mat. The reaction to produce the crosslinked mat composition is shown below in the reaction (8):

(8)

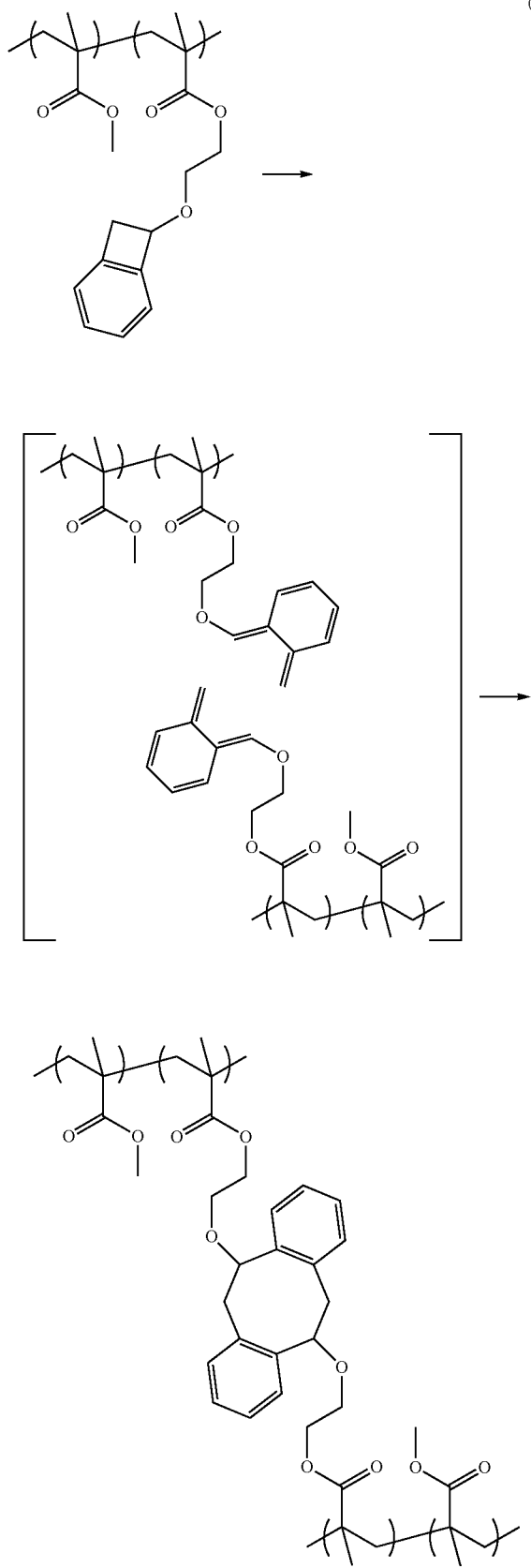

-continued

A photoresist is then disposed upon the mat to perform nano lithography. Portions of the photoresist are then etched away to produce strips of the mat composition on the substrate surface. The remainder of the photoresist and the mat are then etched away to produce strips (See FIG. 1). The mat is present on the substrate in the form of strips having a certain width "w". The brush backfill composition comprises the poly(alkyl acrylate) detailed above. A random copolymer comprising polystyrene and a polyacrylate (e.g., polymethylmethacrylate) is disposed upon the brush backfill composition and the strips.

The brush composition along with an optional catalyst may be solvated in a second solvent and disposed upon the substrate. The optional catalyst is used to react the brush composition to the substrate. It may also be disposed on the substrate via spin casting, spray painting, dip coating, and the like. The substrate with the mat composition (now in the form of strips) and the brush backfill composition may be subjected to annealing under a vacuum to remove the second solvent. The heating may also promote a reaction between the brush backfill composition and the substrate to produce brushes on the substrate surface.

The brush and mat polymers may be subjected to purification steps prior to being disposed upon the substrate. Purification may involve centrifugation, filtration, distillation, decantation, evaporation, treatment with ion exchange beads, and the like. The brush and mat polymers of the present invention optionally further comprise an additive. Additives include polymers (including homopolymers and random copolymers); surfactants; antioxidants; photoacid generators; thermal acid generators; quenchers; hardeners; adhesion promoters; dissolution rate modifiers; photocuring agents; photosensitizers; acid amplifiers; plasticizers; and cross linking agents. Preferred additives include surfactants and antioxidants.

The use of a mat composition that comprises a polyacrylate copolymer (with no polystyrene) and the use of the poly(alkyl acrylate) brush backfill composition produces uniform strips in the random copolymer as it undergoes self-assembly. The directed self assembly of the block copolymer occurs with the poly(alkyl acrylate) lamellar and/or cylindrical domains of the random copolymer aligning vertically with the non-crosslinked polyacrylate domains of the mat.

In one embodiment, one domain of the BCP preferentially interacts with the wetting stripes, for example, if the stripes are made of PMMA-BCB mat, then the PMMA domains of a PS-PMMA will align over the stripes. The backfill brush then needs to have a surface energy tuned to promote alignment of the BCP domains above the brushed regions, which is accomplished by proper selection of the brush surface energy such that it is neutral to or slightly preferential to the other block of the BCP that is not pinned by the mat stripe (PS in this example).

The lamellar and cylindrical domains also have a width "w". Since the etch resistance of the polyacrylate domains in the random copolymer is substantially similar to the etch resistance of the polyacrylate in the mat composition and in the brush backfill composition, the channels in the semiconductor substrate can be uniformly patterned.

A first solvent is used for the solvation of the mat composition, while a second solvent can be used for the solvation of the brush backfill composition. In one embodiment, the first solvent can be the same or different from the second solvent. Solvents that are useful are alcohols (methanol, ethanol, propanol, and the like), ketones (toluene, acetone, or the like), alkylene carbonates (e.g., propylene carbonate, ethylene carbonate, or the like), butyrolactone, acetonitrile, benzonitrile, nitromethane, nitrobenzene, sulfolane, dimethylformamide, N-methylpyrrolidone, toluene, water, ethylene glycols (propylene glycol methyl ether acetate (PGMEA), ethylene glycol monomethyl ether, ethylene glycol monoethyl ether, ethylene glycol monopropyl ether, ethylene glycol monoisopropyl ether, ethylene glycol monobutyl ether, ethylene glycol monophenyl ether, ethylene glycol monobenzyl ether, diethylene glycol monomethyl ether, diethylene glycol monoethyl ether, carbitol cellosolve, diethylene glycol mono-n-butyl ether, ethylene glycol dimethyl ether, ethylene glycol diethyl ether, ethylene glycol dibutyl ether, ethylene glycol methyl ether acetate, ethylene glycol monoethyl ether acetate, ethylene glycol monobutyl ether acetate, or the like), tetrahydrofuran, or the like, or a combination comprising at least one of the foregoing solvents.

In an exemplary embodiment, the solvent for the mat and for the brush composition is a glycol ether.

For the mat composition, the weight ratio of the mat composition to the solvent can be 1:1000 to 1:10, preferably 1:200 to 1:50. For the brush backfill composition, the weight ratio of the brush backfill composition to the solvent can be 1:1000 to 1:5, preferably 1:100 to 1:20.

Several techniques have been developed for facilitating the formation of the desired self assembled morphology in the block copolymer. The use of a moving gradient thermal heating has been described to facilitate the formation of the desired self assembled morphology in the block copolymer. More attention has been described using contact of the film with solvent vapor, either at ambient temperature or elevated temperature, with either a vapor from a single solvent, or vapor from a blend of solvents, or a vapor in which the composition was varied over time, to facilitate the formation of the desired self assembled morphology in the block copolymer. For example, Jung and Ross employed solvent vapor annealing to align the poly(styrene)-b-poly(dimethylsiloxane), and in U.S. Patent Publication No. 2011/0272381, Millward, et al., disclose a solvent annealing method for processing diblock copolymer films such as poly(styrene)-b-poly(dimethylsiloxane).

The etching of the polystyrene-polymethylmethacrylate block copolymer can be conducted using ion beam etching, plasma etching, microwave plasma etching or chemical etching. A preferred method of etching is oxygen plasma etching. The etching is used to remove the domains of the polymethylmethacrylate and then etch into the underlying brush layer.

Because the etch rate of the mat composition is similar to that of the photoresist and is also similar to the etch rate of the brush backfill composition, the channels in the substrate are uniformly spaced. In an exemplary embodiment, the etch rate of the mat composition is greater than 1 nanometer per second, preferably greater than 1.5 nanometers per second.

The Ohnishi numbers of the brush and mat, which can be used to estimate the etch rate, are greater than 2, preferably greater than 4.

The use of the aforementioned composition permits the formation of structures that have a uniform periodicity of less than 100 nanometers, preferably less than 50 nanometers, and more preferably less than 20 nanometers. It also permits the formation of structures that have average largest widths or thicknesses of less than 100 nanometers, preferably less than 50 nanometers, and more preferably less than 20 nanometers.

The following examples are meant to be non-limiting and demonstrate the mat compositions and the brush backfill compositions disclosed herein.

EXAMPLE

The polystyrene mat typically used in directed self assembly, for example as described by Nealey et al in *Macromolecules*, 2011, 44, 1876-1885, is a random copolymer of styrene and 4-vinylbenzocyclobutane (VBCB) containing 2-10% VBCB. This copolymer has an Ohnishi number of 2 (Table 1).

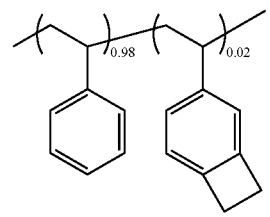

The copolymer typically used as the backfill brush is a random copolymer of styrene and methylmethacrylate bearing a hydroxyl group at the chain end, for example as described by Nealey et al in *Macromolecules*, 2011, 44, 1876-1885. This copolymer typically has 30-70 mole % styrene and an Ohnishi number in the range of 2.9 to 4.1 (Table 1).

TABLE 1

| Polymer | Ohnishi Number |
| --- | --- |
| Polystyrene | 2.0 |
| Polymethylmethacrylate | 5.0 |
| Poly(styrene-random-vinylbenzocyclobutane), 5% VBCB | 2.0 |
| Polymer A<br>Poly(styrene-random-BCBMA),<br>10% BCBMA | 2.1 |
| Polymer B<br>Poly(methylmethacrylate-random-BCBMA),<br>10% BCBMA | 4.8 |
| Polymer C<br>Poly(styrene-random-methylmethacrylate),<br>61.4% styrene | 3.2 |
| Polymer D<br>Polyethylmethacrylate | 4.5 |

Comparative Example 1

This example was conducted to demonstrate the manufacturing of a composition that contains random copolymers of polystyrene and 2-(1,2-dihydrocyclobutabenzen-1-yloxy) ethyl methacrylate (BCBMA). 16.028 g of styrene and 3.972 g of 2-(1,2-dihydrocyclobutabenzen-1-yloxy)ethyl methacrylate (BCBMA) were dissolved in 30.000 g of propylene glycol methyl ether acetate (PGMEA). The monomer solution was degassed by bubbling with nitrogen for 20 minutes. PGMEA (14.964 grams (g)) was charged into a 250 mL three-neck flask equipped with a condenser and a mechanical stirrer and was degassed by bubbling with nitrogen for 20 minutes. Subsequently the solvent in the reaction flask was brought to a temperature of 80° C. V601 (dimethyl-2,2-azodiisobutyrate) (0.984 g) was dissolved in 4.000 g of PGMEA and the initiator solution was also degassed by bubbling with nitrogen for 20 minutes. The initiator solution was added into the reaction flask and then monomer solution was fed into the reactor drop-wise over the 3 hours period under rigorous stirring and nitrogen environment. After monomer feeding was complete, the polymerization mixture was left standing for an additional hour at 80° C. After a total of 4 hours of polymerization time (3 hours of feeding and 1 hour of post-feeding stirring), the polymerization mixture was allowed to cool down to room temperature. Precipitation was carried out in methanol/water (80/20). The precipitated polymer was collected by filtration, air-dried overnight, re-dissolved in THF, and re-precipitated into methanol/water (80/20). The final polymer was filtered, air-dried overnight and further dried under vacuum at 25° C. for 48 hours to produce Polymer A shown below.

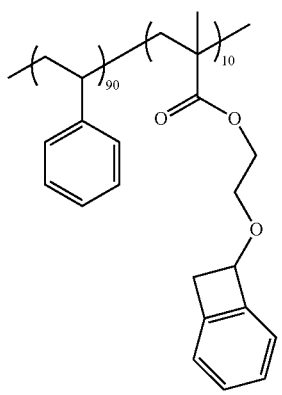

Example 1

This example demonstrates the method of manufacturing of a polyacrylate random copolymer disclosed herein that is used in the mat composition. 15.901 g of methyl methacrylate (MMA) and 4.099 g of 2-(1,2-dihydrocyclobutabenzen-1-yloxy)ethyl methacrylate (BCBMA) were dissolved in 30.000 g of propylene glycol methyl ether acetate (PGMEA). The monomer solution was degassed by bubbling with nitrogen for 20 minutes. PGMEA (15.037 g) was charged into a 250 mL three-neck flask equipped with a condenser and a mechanical stirrer and was degassed by bubbling with nitrogen for 20 minutes. Subsequently the solvent in the reaction flask was brought to a temperature of 80° C. V601 (dimethyl-2,2-azodiisobutyrate) (1.016 g) was dissolved in 4.000 g of PGMEA and the initiator solution was also degassed by bubbling with nitrogen for 20 minutes. The initiator solution was added into the reaction flask and then monomer solution was fed into the reactor drop-wise over the 3 hours period under rigorous stirring and nitrogen environment. After monomer feeding was complete, the polymerization mixture was left standing for an additional hour at 80° C. After a total of 4 hours of polymerization time (3 hours of feeding and 1 hour of post-feeding stirring), the polymerization mixture was allowed to cool down to room temperature. Precipitation was carried out in methanol/water (80/20). The precipitated polymer was collected by filtration, air-dried overnight, re-dissolved in THF, and re-precipitated into methanol/water (80/20). The final polymer was filtered, air-dried overnight and further dried under vacuum at 25° C. for 48 hours to produce a mat composition (called Polymer B) having the structure shown below. The copolymer has an Ohnishi number of 4.8.

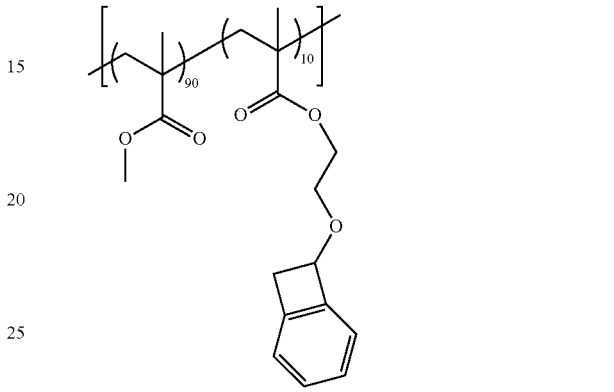

Example 2

This example was conducted to demonstrate the etch rate measurement of polymer mats.

Polymers A and B were dissolved in PGMEA (3.0 wt %), spin-coated on a bare silicon wafer at 3000 rpm and then soft-baked at 150° C. for 2 minutes to give the initial film thickness of ~45 nanometers. Both the polymer A and polymer B mat compositions were subjected to an $O_2$ plasma for various durations and the remaining thickness was measured and plotted as a function of time in FIG. 5. From the FIG. 5, it may be seen that the etch rate of the polymer B mat (mat comprising the polyacrylate copolymer) is almost twice faster than that of the Polymer A mat (polystyrene mat) under the conditions given in the table in FIG. 5.

Comparative Example 3

This comparative example was conducted to demonstrate the manufacturing and etching of a random polymer comprising polystyrene and polymethylmethacrylate (poly(styrene-r-methylmethacrylate)-OH (61.4/38.6)) that forms the brush backfill composition. Styrene and methyl methacrylate (MMA) were passed through basic alumina. In a 250 mL reactor (equipped with a septum), styrene (20.000 g), MMA (13.314 g), CuBr (0.191 g) and anisole (54 ml) were added and purged using nitrogen for 45 minutes. Ligand (PMDETA, 0.4615 g) (which enables an ATRP reaction) was injected via a syringe into the reaction mixture under a continued nitrogen purge for another 15 minutes. The temperature was raised to 95° C. After 10 minutes, the initiator was syringed into the reactor. Nitrogen purge was then discontinued. Polymerization was stopped when the molecular weight reached 10,000 grams per mole. The polymerization mixture was passed through basic alumina and then precipitated into methanol. The precipitate was dissolved in tetrahydrofuran and was again passed through basic alumina, followed by cation exchange resin and re-precipitated using methanol. The white powder was filtered and dried overnight at 50° C. to give Polymer C having the structure shown below, with 61.4 mole % styrene and 38.6 mole % methylmethacrylate and an Ohnishi number of 3.2.

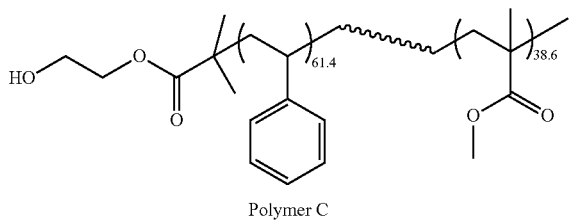

Polymer C

Example 3

This example was conducted to demonstrate the manufacturing of the disclosed brush backfill composition that comprises a poly(alkyl methacrylate). In this particular example, the brush composition comprises poly(ethyl methacrylate). Ethyl methacrylate (EMA) was passed through basic alumina. In a 250 mL reactor (equipped with a septum), EMA (20.000 g), CuBr (0.114 g) and anisol (60 g) were added and purged using nitrogen for 45 minutes. Ligand (PMDETA, 0.277 g) was injected via a syringe into the reaction mixture under a continued nitrogen purge for another 15 minutes. The temperature was brought to 95° C. After 10 minutes, the initiator was syringed into the reactor. Nitrogen purge was then discontinued. Polymerization was stopped when the molecular weight reaches ~10,000 grams per mole. The polymerization mixture was passed through basic alumina and then precipitated into methanol. The precipitate was dissolved in tetrahydrofuran and again passed through basic alumina, followed by cation exchange resin treatment (for salt and ion removal) and re-precipitation from methanol. The white powder was filtered and dried overnight at 50° C. to give Polymer D, which had an Ohnishi number of 4.5.

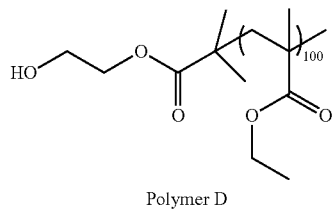

Polymer D

Example 4

Figure 7:
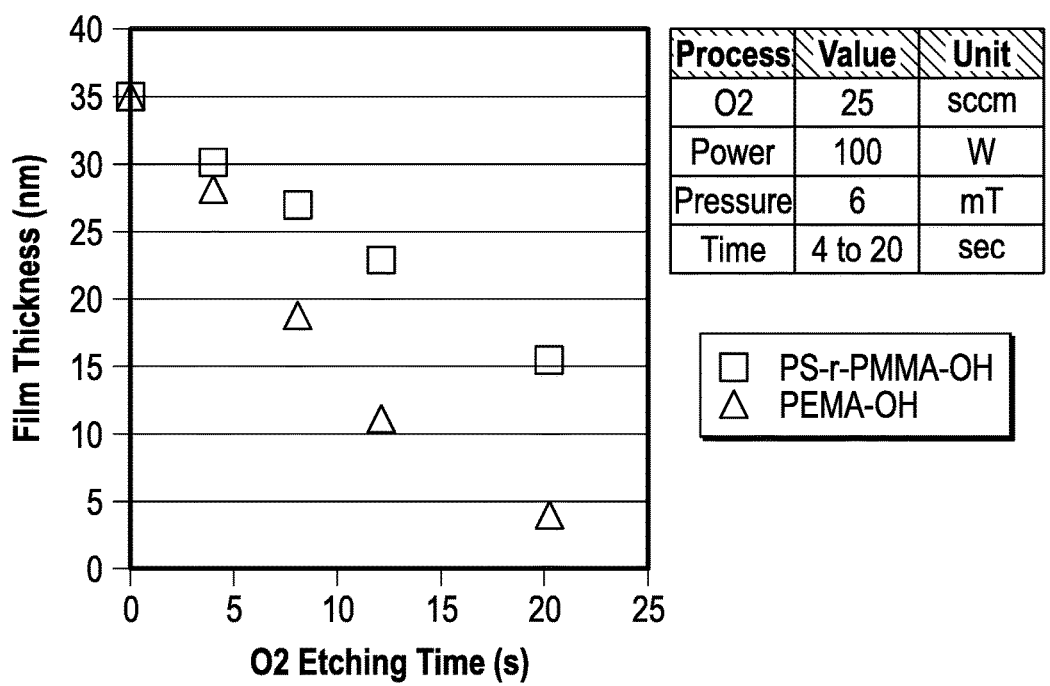
FIG. 7 is a plot of film thickness as a function of $O_2$ plasma etching time.

This example was conducted to make an evaluation of the neutral brush polymers (by finger-print morphology formation). Polymer C and D were dissolved in PGMEA (1.3 wt %), spin-coated on a bare silicon wafer at 3000 rpm and then baked at 250° C. for 20 minutes. Unreacted brushes were removed by rinsing twice with PGMEA. A thin film of a polystyrene-block-polymethylmethacrylate block copolymer (PS-b-PMMA) was then disposed on the brush-coated substrates by spin coating a solution of PS-b-PMMA in PGMEA and then baking at 250° C. for 2 minutes. The morphology was then imaged with atomic force microscopy (AFM). FIG. 6 shows fingerprint patterns generated by PS-b-PMMA on PS-r-PMMA brush (A) and PEMA-OH (B) which were grafted onto a bare Si wafer. The fingerprint pattern generated on the PEMA-OH brush (B) demonstrates the desirable characteristic of a neutral surface that is non-preferential for either block of the PS-b-PMMA. However, this brush is advantaged over the PS-r-PMMA brush, because of its higher Ohnishi number, 4.5 compared to 3.2 (Table 1), and faster etch rate as demonstrated in FIG. 7.

Example 5

This example demonstrates the etch rates when using the polymer brushes from Comparative Example 3 and Example 3. Polymer C and D were dissolved in PGMEA (1.3 wt %), spin-coated on a bare silicon wafer at 3000 rpm and then soft-baked at 150° C. for 2 minutes to give the initial film thickness of ~35 nm. Both PS-r-PMMA-OH (Polymer C) and PEMA-OH (Polymer D) neutral brushes were subjected to $O_2$ plasma for various durations and the remaining thickness was measured and plotted as a function of time in FIG. 7. The etch rate of acrylate-based neutral brush (PEMA-OH) is almost twice faster than that of PS-r-PMMA-OH brush under the condition given in the table in FIG. 7.

From the foregoing examples, it may seen that the etch rate for mat compositions that contain polyacrylate copolymers and for brush backfill compositions that contain poly(alkyl acrylate)s is at least twice that of the etch rate of mat compositions and brush backfill compositions that contain polystyrene.

In one embodiment, the etch rate for mat compositions that contain polyacrylate copolymers and for brush backfill compositions that contain poly(alkyl acrylate)s is at least 1.2 times, preferably at least 1.5, and more preferably at least 2 times that of the etch rate of mat compositions and brush backfill compositions that contain polystyrene.

What is claimed is:

1. A method comprising:
   disposing a mat composition on a surface of a semiconductor substrate; where the mat composition comprises a random copolymer comprising a first acrylate unit and a second unit; where the random copolymer does not comprise a polystyrene or a polyepoxide;
   crosslinking the random copolymer;
   disposing a brush backfill composition on the substrate; such that the brush backfill composition and the mat composition alternate with each other;
   disposing on the brush backfill composition and on the mat composition a block copolymer that undergoes self assembly; and
   etching the block copolymer to create uniformly spaced channels in the semiconductor substrate.

2. The method of claim 1, further comprising disposing a photoresist on the mat composition and etching the mat composition.

3. The method of claim 1, where the first acrylate unit is derived from polymerization of monomers having a structure represented by formula (1):

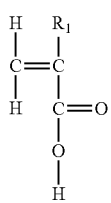

where $R_1$ is a hydrogen or an alkyl group having 1 to 10 carbon atoms; or is derived from polymerization of monomers having a structure represented by the formula (2):

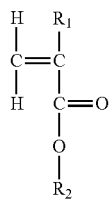

(2)

where $R_1$ is a hydrogen or an alkyl group having 1 to 10 carbon atoms and $R_2$ is a $C_{1-10}$ alkyl, a $C_{3-10}$ cycloalkyl, or a $C_{7-10}$ aralkyl group.

4. The method of claim 1, where the second unit derived from a polymerization of 2-(1,2-dihydrocyclobutabenzen-1-yloxy)ethyl methacrylate.

5. The method of claim 1, where the mat composition comprises the structure shown below upon undergoing crosslinking

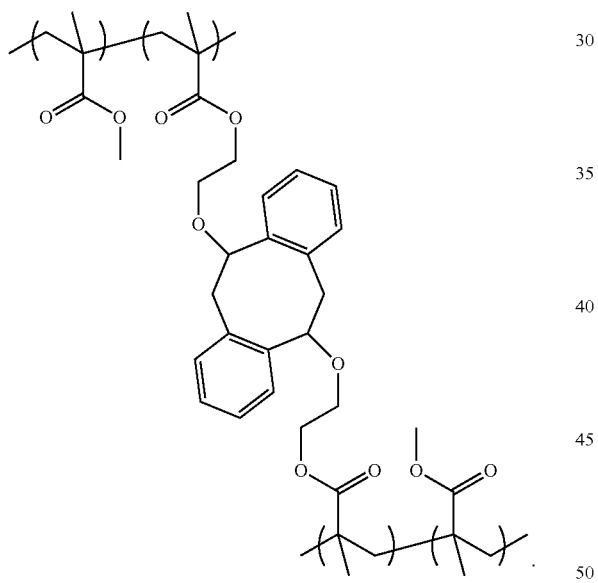

(6)

6. The method of claim 1, where the second unit is derived from polymerization and/or crosslinking of crosslinkable monomers shown in formulas I-1 to I-20 and formulas M-1 to M-27:

(I-1)

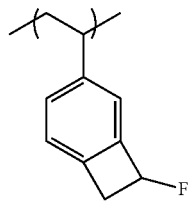 (I-2)

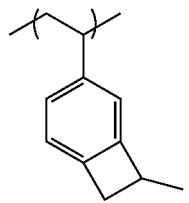 (I-3)

(I-4)

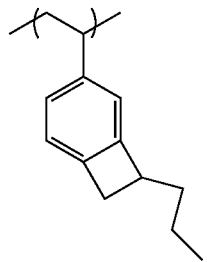

(I-5)

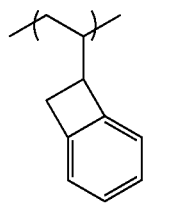

(I-6)

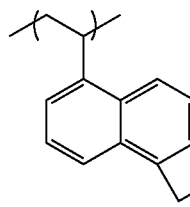

(I-7)

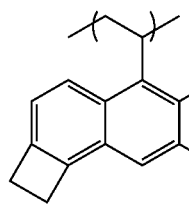

(I-8)

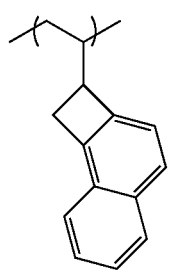

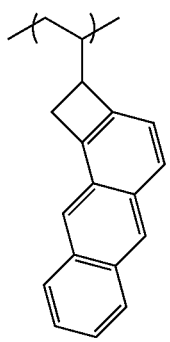 (I-9)
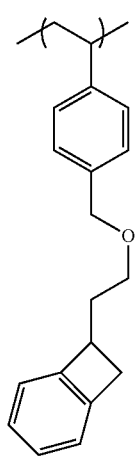 (I-10)
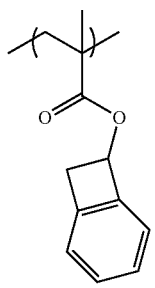 (I-11)
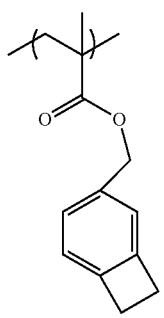 (I-12)
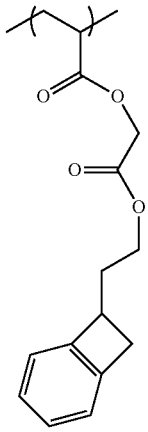 (I-13)
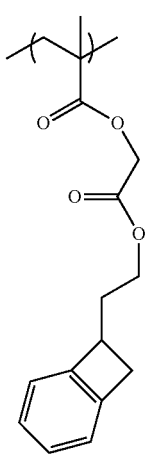 (I-14)
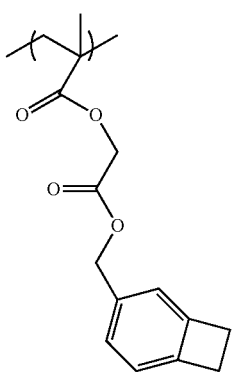 (I-15)
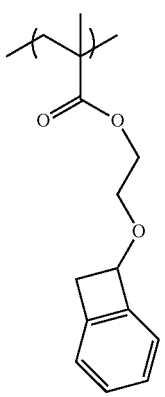 (I-16)

(I-17)
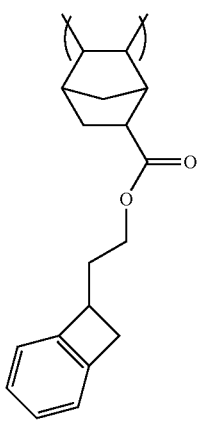
(I-18)
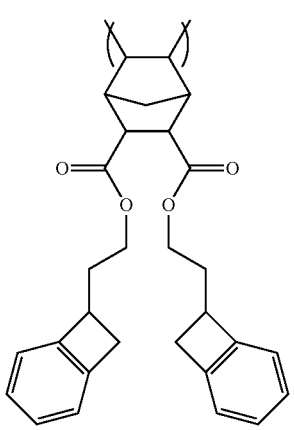
(I-19)
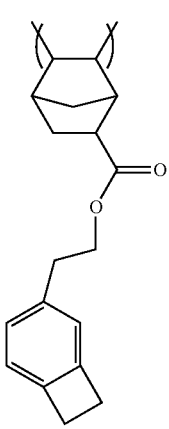
(I-20)
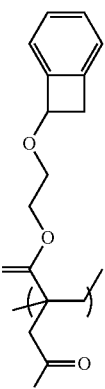
(M-1)
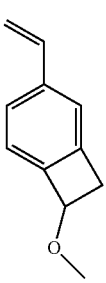
(M-2)
(M-3)
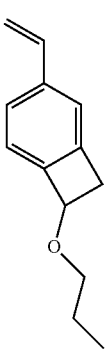

(M-4) 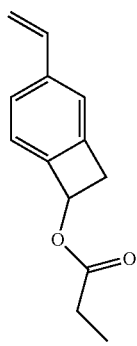
(M-5) 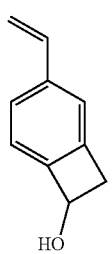
(M-6) 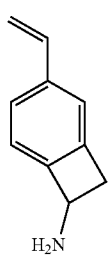
(M-7) 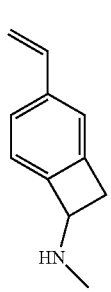
(M-8) 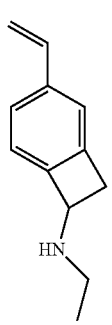
(M-9) 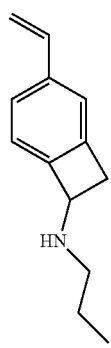
(M-10) 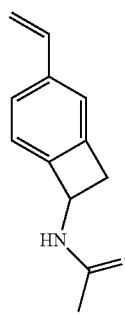
(M-11) 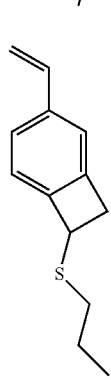
(M-12) 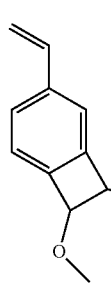
(M-13) 

-continued
(M-14)
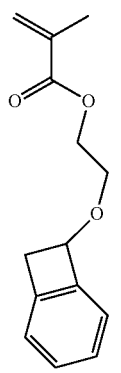
(M-15)
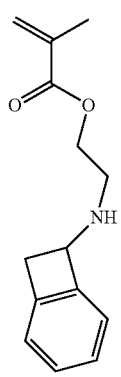
(M-16)
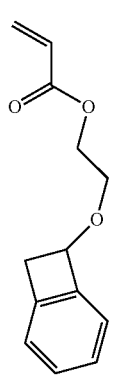
(M-17)
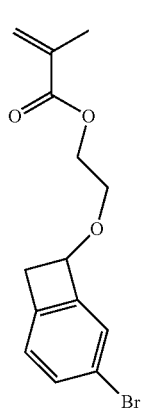
-continued
(M-18)
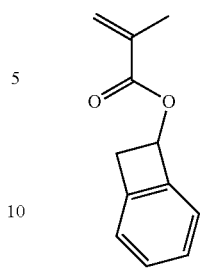
(M-19)
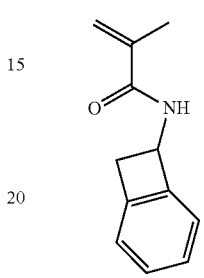
(M-20)
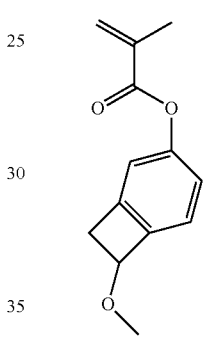
(M-21)
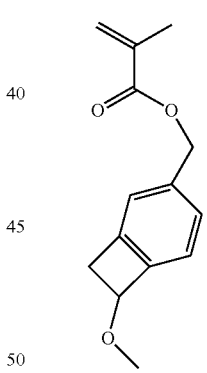
(M-22)
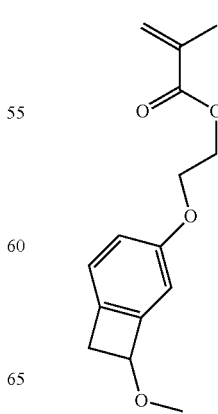

(M-23)
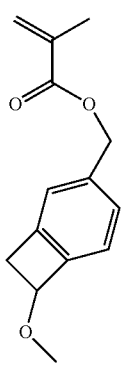
(M-24)
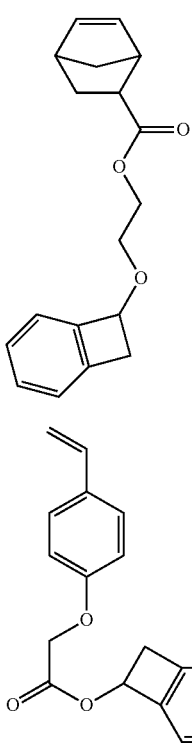
(M-25)
(M-26)
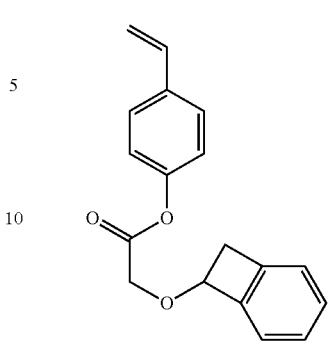
(M-27)
* * * * *